(12) United States Patent
Son

(10) Patent No.: US 6,225,682 B1
(45) Date of Patent: May 1, 2001

(54) SEMICONDUCTOR MEMORY DEVICE HAVING ISOLATION STRUCTURE AND METHOD OF FABRICATING THE SAME

(75) Inventor: Jeong-Hwan Son, Daejon (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/046,631

(22) Filed: Mar. 24, 1998

(30) Foreign Application Priority Data

Mar. 24, 1997 (KR) .................................................. 97/10084

(51) Int. Cl.$^7$ .................................................. H01L 23/58
(52) U.S. Cl. .......................... 257/649; 257/649; 257/639; 257/509; 257/647; 438/218; 438/219; 438/220; 438/221; 438/225; 438/362
(58) Field of Search ..................................... 257/649, 758, 257/506, 640, 639, 509, 647; 438/362, 218–221, 225

(56) References Cited

U.S. PATENT DOCUMENTS

| | | | |
|---|---|---|---|
| 5,358,893 | * 10/1994 | Yang et al. | 437/70 |
| 5,482,878 | * 1/1996 | Burger et al. | 438/217 |
| 5,658,822 | * 8/1997 | Wu et al. | 438/446 |
| 5,668,403 | * 9/1997 | Kunikiyo | 257/639 |
| 5,756,390 | * 5/1998 | Juengling et al. | 438/439 |
| 5,763,316 | * 6/1998 | Chen et al. | 438/446 |
| 5,763,317 | * 6/1998 | Lee et al. | 438/448 |
| 5,824,594 | * 10/1999 | Kim et al. | 438/446 |
| 5,913,133 | * 6/1999 | Lee | 438/444 |
| 6,033,991 | * 3/2000 | Ramkumar et al. | 438/713 |
| 6,093,603 | * 7/2000 | Yamaguchi | 438/257 |

OTHER PUBLICATIONS

Sambonsugi, et al, "Oxynitride Pad LOCOS (On–LOCOS) Isolaiton Technology for Gigabit DRAMs," in SSDM, P.139(1995).

* cited by examiner

Primary Examiner—Matthew Smith
Assistant Examiner—Granvill Lee
(74) Attorney, Agent, or Firm—Birch, Stewart, Kolasch & Birch, LLP

(57) ABSTRACT

A fabrication method for a semiconductor memory device having an isolation structure which includes the steps of forming a pad oxide film on a semiconductor substrate, forming a first nitride film on the pad oxide film, patterning the first nitride film and the pad oxide film, forming an oxynitride film on a portion of the substrate externally exposed by the patterning step, forming side walls of a second nitride film on sides of the first nitride film, removing a portion of the oxynitride film using the side walls as a mask, forming a field oxide film on an exposed portion of the substrate, and removing the remaining pad oxide film, first nitride film, second nitride film, and oxynitride film. The first nitrate film and the pad oxide film may be patterned such that the pad oxide film is undercut to expose more of the substrate and to allow formation of the oxynitride film under the first nitride film. As such, the first nitride film can be used as a mask, rendering unnecessary the formation of side walls. The method simultaneously employs an oxide film and an oxynitride film to decrease a bird's beak generation while minimizing stress resulting from the oxynitride film.

19 Claims, 6 Drawing Sheets

SEMICONDUCTOR MEMORY DEVICE HAVING ISOLATION STRUCTURE AND METHOD OF FABRICATING THE SAME

BACKGROUND OF THE INVENTION

1. Field of the Invention

The present invention relates to a semiconductor memory device and a fabrication method for the same, and more particularly, to an improved semiconductor device fabrication method and a resulting semiconductor memory device having an isolation structure formed by a local oxidation of silicon (LOCOS) method for obtaining a decreased bird's beak and stress.

2. Description of the Conventional Art

In a conventional semiconductor memory device having a LOCOS isolation structure, a channel is formed between a source region and a drain region in the memory device when a predetermined voltage, which is higher than a threshold voltage, is applied to a gate. The magnitude of the threshold voltage required to form the channel is proportional to the thickness of a gate oxide film. Thus, when a field oxide film is about ten times thicker than the gate oxide film, a channel of a transistor provided on a field region is opened by applying a voltage to the gate that is ten times larger than the voltage ordinarily required for turning on the transistor. Thus, an electrical isolation between cells of a semiconductor memory device is sufficient to prevent the transistor from being turned on in response to a voltage ordinarily large enough to turn on the transistor when applied to a gate of an adjacent transistor separated by a field oxide film.

The fabrication method of the conventional LOCOS isolation structure will now be described with reference to FIGS. 1A through 1C.

As shown in FIG. 1A, an upper surface of an Si substrate 11 is oxidized to form a pad oxide film 12 having a thickness of 35 nm. A nitride film 13 having a thickness of 100 nm is deposited on the pad oxide film 12. Nitride film 13 functions as an anti-oxidation film. As further shown in FIG. 1B, a photoresist film 14 is formed and patterned on the nitride film 13. Using the patterned photoresist film 14, the nitride film 13 and the pad oxide film 12 are patterned. Referring to FIG. 1C, the photoresist film 14 is removed and the entire structure is oxidized using a wet oxidation method. During the wet oxidation method, a portion of the substrate 11 covered with the nitride film 13 is not oxidized. By contrast, the exposed surface of the substrate 11 that is not covered with the nitride film 13 is oxidized. As a result of the oxidation of the exposed surface of substrate 11, the field oxide film 15 swells to about an 800 nm thickness, thereby accomplishing an isolation between the cells in accordance with the field oxide film 15.

In the above-described conventional LOCOS isolation structure for a semiconductor memory device, the pad oxide film 12 does not efficiently block the growth of the field oxide film 15 during the oxidation step for forming the field oxide film 15, as shown in FIG. 1C. Consequently, a bird's beak phenomenon is generated in which each end portion of the field oxide film 15 extends under the pad oxide film 12. In recent years, Y. Sambonsugi et al. published an article entitled, "Oxynitride Pad LOCOS(ON-LOCOS) Isolation Technology for Gigabit DRAMs" in SSDM p. 139, 1995, disclosing a method for decreasing a birds beak by substituting an oxynitride film for the pad oxide film 12. A brief description of that article will now follow.

First, when an Si substrate is nitrated under an atmospheric gas of $NH_3$/Ar for 10 minutes at temperatures ranging from 500° C. to 900° C. and then is dry-oxidized for 30 minutes at a temperature of 900° C., a 3 nm thickness of oxynitride film is grown on the substrate. The density of nitrogen in the oxynitride film can be varied by adjusting the temperature during the nitridation. After growing the oxynitride film, a nitride film is deposited. The nitride film is patterned and dry-etched and then the oxynitride film is etched using HF gas. The next steps are identical to those of the conventional fabrication method for a LOCOS isolation structure, as shown in FIG. 1A–1C. As described above, the oxynitride film is employed instead of the pad oxide film. Thus, when the oxidation process is carried out to form the field oxide film, an oxidant diffusion is prevented by the nitride component, which is included in the oxynitride film. Stated differently, the oxynitride film efficiently blocks the growth of the field oxide film, thereby decreasing the bird's beak.

Moreover, the oxynitride film decreases the bird's beak when compared with the use of an oxide film. However, because the oxynitride film has a thermal coefficient larger than that of the oxide film, stress is increased during the oxidation process used to form the field oxide film.

SUMMARY OF THE INVENTION

It is an object of the present invention to overcome the problem inherent in the above-described convention systems, It is also an object of the present invention to provide a fabrication method for a semiconductor memory device having an isolation structure which is appropriate for obtaining a decreased bird's beak and stress, while forming an isolation structure according to a local oxidation of silicon (LOCOS).

To achieve the above and other objects, a method of fabricating an isolation structure for a semiconductor device includes the steps of forming more than one separated oxynitride region on a semiconductor substrate, and forming a field oxide film on an exposed surface portion of a semiconductor substrate positioned between the separated oxynitride regions. The step of forming more than one separated oxynitride region may include forming an oxynitride film on the semiconductor substrate, and dividing the oxynitride film into more than one oxynitride region using an etching process, revealing the exposed surface portion of the semiconductor substrate between the separated oxynitride regions. The method may also include removing the pad oxide film, first nitride film and oxynitride regions.

More than one separated oxynitride region may also be formed by sequentially forming a pad oxide film and first nitride film on the semiconductor substrate, patterning the first nitride film and the pad oxide film to expose a first surface portion of the semiconductor substrate, forming an oxynitride film on the first surface portion of the semiconductor substrate, and removing a portion of the oxynitride film to expose a second surface portion of the semiconductor substrate and to effectively form more than one separated oxynitride region. The portion of the oxynitride film may be removed using an etching method which employs an HF gas or a wet etching method.

A portion of the oxynitride film may be removed using an etching process which uses side walls of a second nitride film that are formed on sides of the first nitride film as a mask. The side walls are formed by etching the second nitride film after being formed on the sides of the first nitride film, the side walls being formed to have a thickness ranging from about 50–500 angstroms Alternatively, a portion of the oxynitride film may be removed by using the first nitride film as a mask while using one of a dry etching method and a wet etching method.

Alternatively, if the first nitride film and the pad oxide film are patterned by removing a region of the pad oxide film positioned under an undercut portion of the nitride film, the first surface portion of the semiconductor substrate includes a portion of the substrate positioned under the undercut portion of the nitride film, and the portion of the oxynitride film is removed using the undercut portion of the nitride film as a mask.

In either case, the field oxide film may be formed using a thermal oxidation process, the first nitride film may be formed using a chemical vapor deposition method, and the oxynitride film is formed by nitrating and dry-oxidizing the exposed portion of the substrate. Furthermore, the first nitride film and the pad oxide film may be patterned using a reactive ion etching method. The pad oxide film, oxynitride film and side walls may be formed to have thicknesses ranging from about 50–500 angstroms and the first nitride film may be formed to have a thickness ranging from about 500–3000 angstroms.

Further scope of applicability of the present invention will become apparent from the detailed description given hereinafter. However, it should be understood that the detailed description and specific examples, while indicating preferred embodiments of the invention, are given by way of example only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

With reference to FIGS. 2A–3F, a fabrication method and resulting semiconductor memory device having an isolation structure will now be described according to the preferred embodiments of the present invention.

FIGS. 2A–2H illustrate a first embodiment according to the present invention.

Figure 1A:
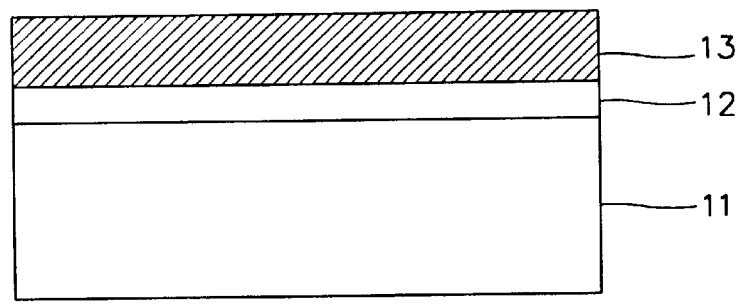
FIGS. 1A through 1C are cross-sectional views sequentially illustrating a conventional LOCOS isolation structure for a semiconductor memory device during its manufacturing process.
Figure 1B:
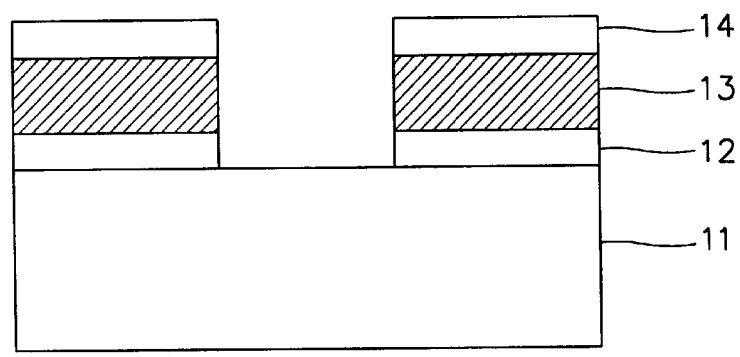
Figure 1C:
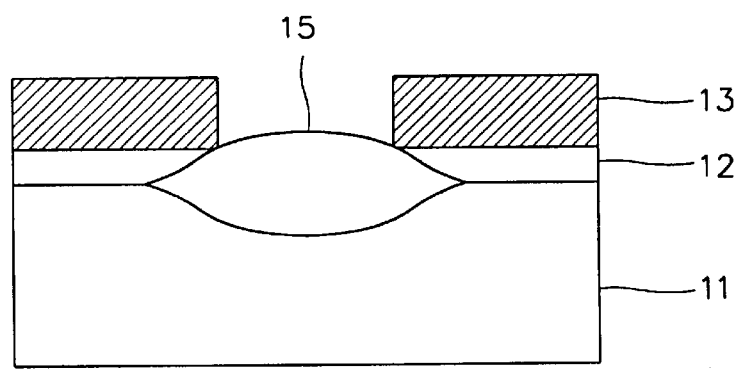
Figure 2A:
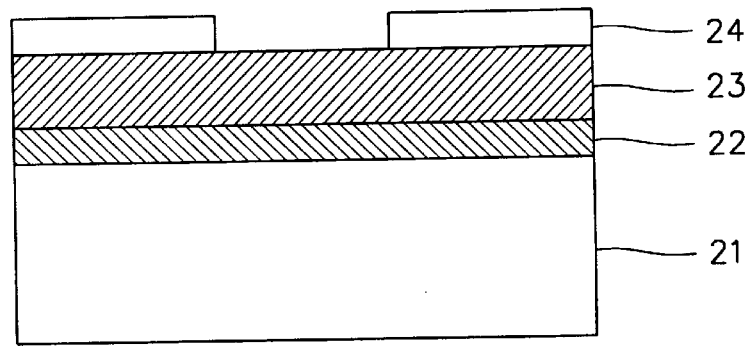
FIGS. 2A through 2H are cross-sectional views sequentially illustrating a LOCOS isolation structure for a semiconductor memory device according to an embodiment of the present invention.

As shown in FIG. 2A, a pad oxide film 22 and a first nitride film 23 are sequentially formed on a semiconductor substrate 21. The pad oxide film 22 is formed to have a thickness of about 50–500 A using a thermal oxidation process. The first nitride film 23 is formed to have a thickness of about500–3000 A using a chemical vapor deposition (CVD) method. On the first nitride film 23, a photoresist film 24 is formed and patterned.

Figure 2B:
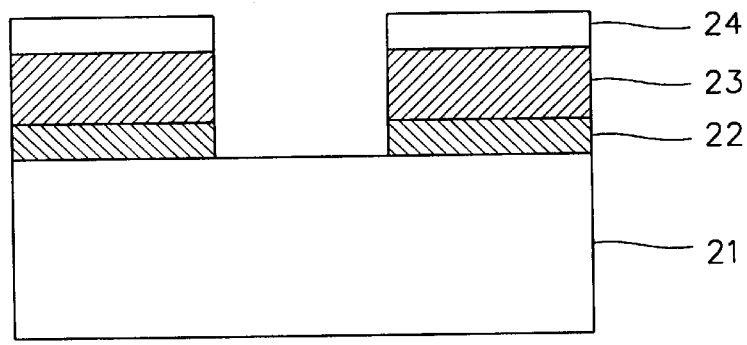

Referring to FIG. 2B, using the patterned photoresist film 24, the first nitride film 23 and the pad oxide film 22 are dry-etched by a reactive ion etching (RIE) method, thereby forming the patterned first nitride film 23 and the patterned pad oxide film 22.

Figure 2C:
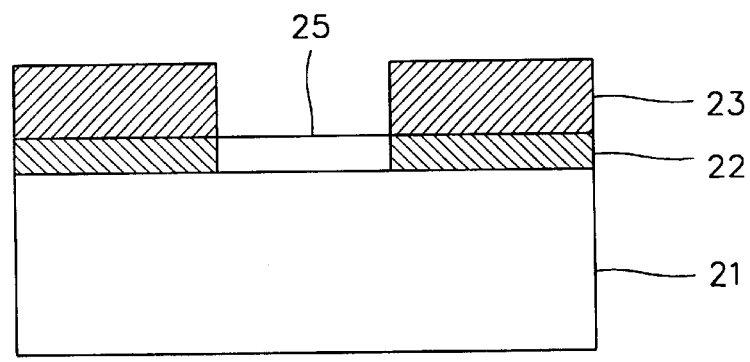

As shown in FIG. 2C, after removing the photoresist film 24, the first nitride film 23 and the pad oxide film 22 are etched so as to expose a portion of the semiconductor substrate 21. The oxynitride film 25 is formed by nitrating the surface of the exposed semiconductor substrate 21 and performing a dry oxidation. The thickness of the oxynitride film 25 is preferably identical to that of the pad oxide film 22.

Figure 2D:
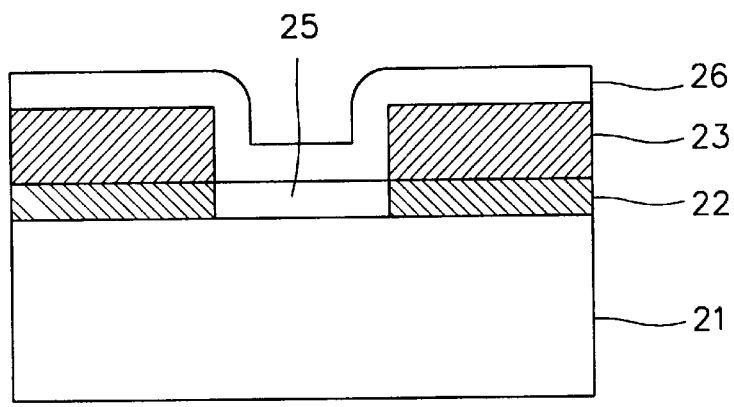
Figure 2E:
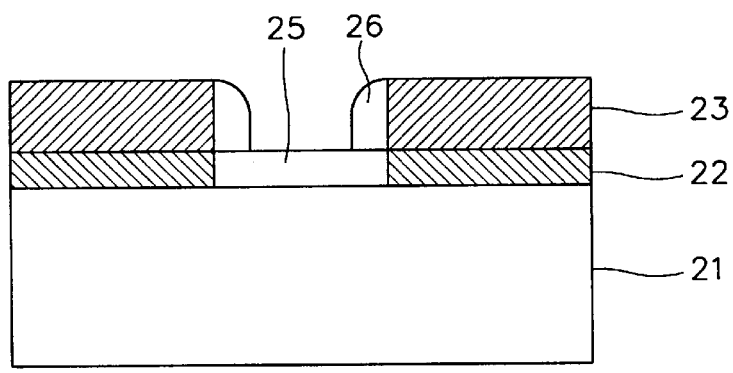

As further shown in FIG. 2D, a second nitride film 26 is deposited on an upper surface of the entire structure with a thickness ranging between about 300–1000Å . The second nitride film 26 is etched as shown in FIG. 2E to form side walls on the sides of the first nitride film 23. Then, as shown in FIG. 2F, using a gas such as HF, an exposed portion of the surface of the oxynitride film 25 is removed by etching.

Figure 2F:
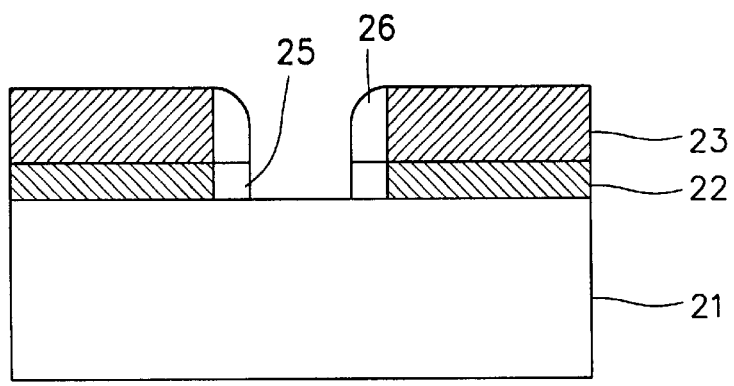
Figure 2G:
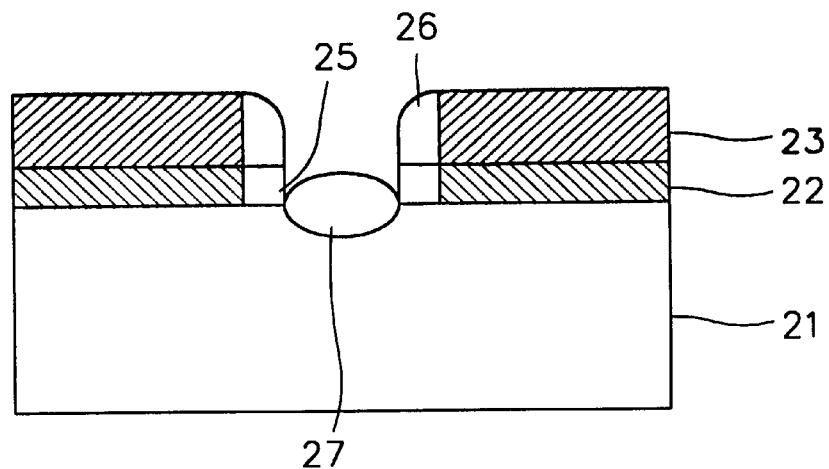
Figure 2H:
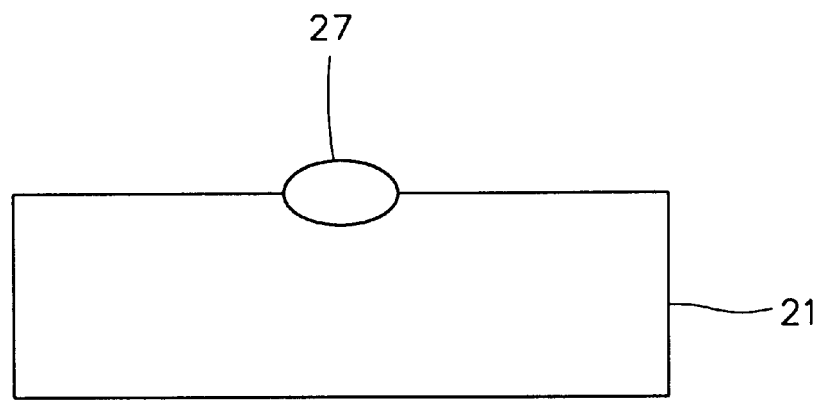

Referring to FIG. 2G, the entire structure of FIG. 2F is oxidized by a wet oxidation method to thereby form a field oxide film 27. As shown in FIG. 2H, the pad oxide film 22, the first nitride film 23, the second nitride film 26 and the oxynitride film 25 are removed to complete a LOCOS isolation structure for the semiconductor memory device.

FIGS. 3A–3D illustrate another embodiment of the present invention.

Figure 3A:
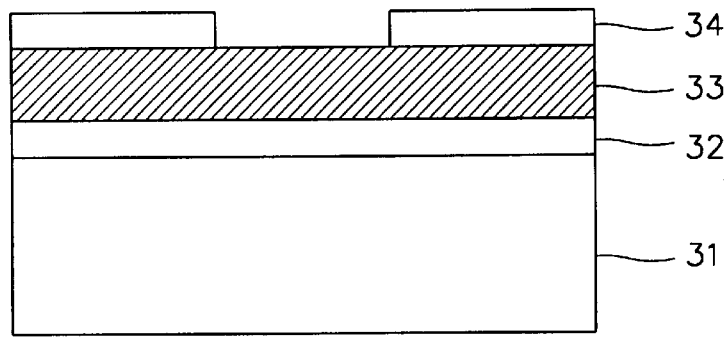
FIGS. 3A through 3F are cross-sectional views sequentially illustrating a LOCOS isolation structure for a semiconductor memory device according to another embodiment of the present invention.

As shown in FIG. 3A, a pad oxide film 32 and a nitride film 33 are formed on a semiconductor substrate 31. A photoresist film 34 is formed on the nitride film 33 and then patterned. Using a thermal oxidation method, the pad oxide film 32 is formed ranging from about 50 to 500 A in thickness. The nitride film 33 is formed to have a thickness of about 500–3000 A using a chemical vapor deposition (CVD).

Figure 3B:
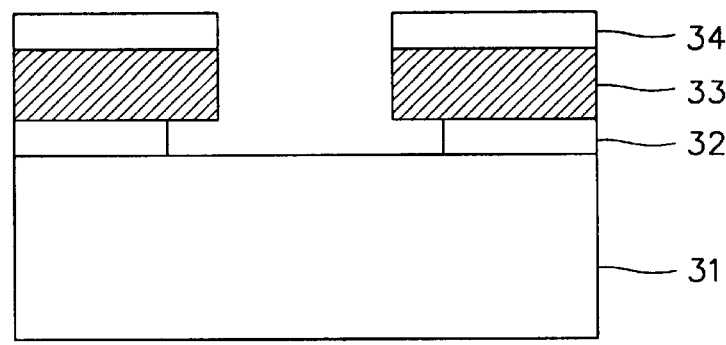

Next, as shown in FIG. 3B, using the patterned photoresist film 34, the nitride film 33 is etched and patterned. The pad oxide film 32 is undercuttingly etched using a dry angular etching or a wet angular etching.

Figure 3C:
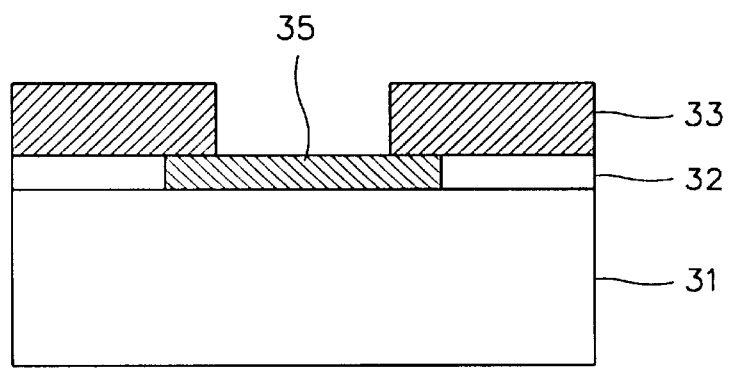

As shown in FIG. 3C, after removing the photoresist film 34, the nitride film 33 and the pad oxide film 32 are etched to form an oxynitride film 35 on a portion of the exposed semiconductor substrate 31. The oxynitride film 35 is formed by nitrating the surface of the exposed semiconductor substrate 31 and performing a dry oxidation process. Preferably, the thickness of the oxynitride film 35 is identical to the thickness of the pad oxide film 32. Specifically, pad oxide film 32 may be dry etched by employing a $CHF_3+O_2$, which has an etching selectivity of nitride with respect to oxide. Alternatively, pad oxide 32 may be wet etched using buffered oxide etchant (BOE), that is, a solution of $HF^+$ which has an etching selectivity of nitride with respect to the oxide. Using either of these dry or wet etching methods, pad oxide 32 can be undercuttingly removed without damaging nitride film 33.

Figure 3D:
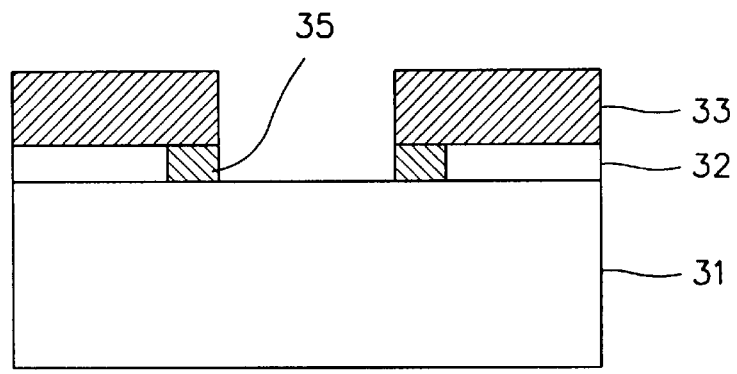
Figure 3E:
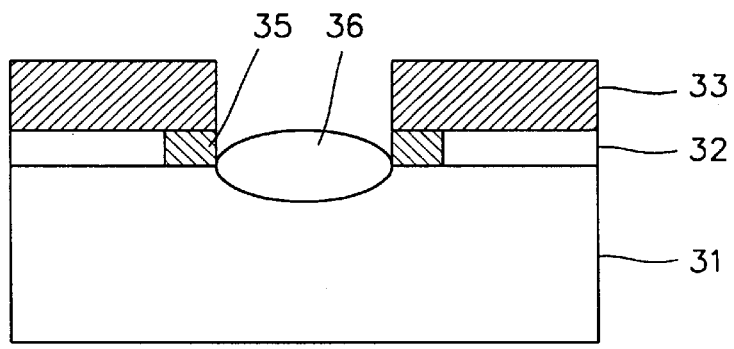
Figure 3F:
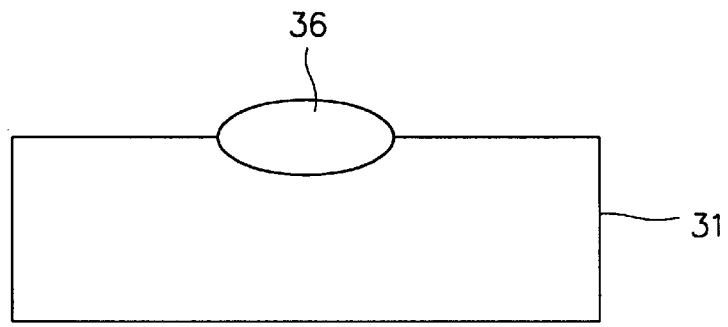

As shown in FIG. 3D, using the nitride film 33 as a mask, the oxynitride film 35 is etched. As shown in FIG. 3E, the entire structure in FIG. 3D is oxidized using a wet oxidation method to form a field oxide film 36. As shown in FIG. 3F, the pad oxide film 32, the nitride film 33, and the oxynitride film 35 are removed to complete the LOCOS isolation structure for a semiconductor memory device according to the present invention.

As described above, the fabrication method for a semiconductor memory device having an isolation structure according to the present invention decreases a bird's beak generation and minimizes stress resulting from the oxynitride film by simultaneously using an oxide film and an oxynitride film, rather than using a pad oxide film or an oxynitride film alone.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a continuation or divisional application.

What is claimed is:

1. A method of fabricating an isolation structure for a semiconductor device, comprising:

sequentially forming a pad oxide film and first nitride film over a semiconductor substrate;

patterning the first nitride film and the pad oxide film to expose a first surface portion of the semiconductor substrate;

forming an oxynitride film over the first surface portion of the semiconductor substrate;

removing a portion of the oxynitride film to expose a second surface portion of the semiconductor substrate to effectively form more than one separate oxynitride region; and forming a field oxide film on the second exposed surface portion of the semiconductor substrate positioned between the separated oxynitride regions.

2. The method recited by claim 1, wherein the step of removing the portion of the oxynitride film comprises:

forming side walls of a second nitride film on sides of the first nitride film; and removing the portion of the oxynitride film using the side walls as a mask.

3. The method recited by claim 2, wherein the side walls are formed by etching the second nitride film formed on the sides of the first nitride film, the side walls being formed to have a thickness ranging from about 50–500 angstroms.

4. The method recited by claim 1, wherein the step of removing comprises:

removing a portion of the oxynitride film using one of a dry etching method and a wet etching method, during which the first nitride film is used as a mask.

5. The method recited by claim 1, wherein the step of patterning comprises:

removing a region of the pad oxide film positioned under an undercut portion of the nitride film, where the first surface portion of the semiconductor substrate includes a portion of the substrate positioned under the undercut portion of the nitride film, and where the portion of the oxynitride film is removed using the undercut portion of the nitride film as a mask.

6. The method recited by claim 1, wherein the field oxide film is formed using a thermal oxidation process.

7. The method recited by claim 6, wherein the pad oxide film is formed to have thickness ranging from about 50–500 angstroms.

8. The method recited by claim 1, wherein the first nitride film is formed using a chemical vapor deposition method.

9. The method recited by claim 8, wherein the first nitride film is formed to have a thickness ranging from about 500–3000 angstroms.

10. The method recited by claim 1, wherein the first nitride film and the pad oxide film are patterned using a reactive ion etching method.

11. The method recited by claim 1, wherein the oxynitride film is formed by nitrating and dry-oxidizing the exposed portion of the substrate.

12. The method recited by claim 11, wherein the oxynitride film is formed to have a thickness ranging from about 50–500 angstroms.

13. The method recited by claim 1, wherein the oxynitride film is removed using an etching method which employs an HF gas.

14. The method recited by claim 1, wherein the oxynitride film is removed using a wet etching method.

15. The method recited by claim 1, further comprising:

removing the pad oxide film, first nitride film and oxynitride regions.

16. An isolation structure for a semiconductor device produced by the following process:

sequentially forming a pad oxide film and first nitride film over a semiconductor substrate;

patterning the first nitride film and the pad oxide film to expose a first surface portion of the semiconductor substrate;

forming an oxynitride film over the first surface portion of the semiconductor substrate;

removing a portion of the oxynitride film to expose a second surface portion of the semiconductor substrate to effectively form more than one separate oxynitride region; and forming a field oxide film on the second exposed surface portion of the semiconductor substrate positioned between the separated oxynitride regions.

17. The isolation structure formed by the process recited by claim 16, wherein the step of removing the portion of the oxynitride film comprises;

forming side walls of a second nitride film on sides of the first nitride film; and removing the portion of the oxynitride film using the side walls as a mask.

18. The isolation structure formed by the process recited by claim 16, wherein the step of removing comprises:

removing a portion of the oxynitride film using one of a dry etching method and a wet etching method, during which the first nitride film is used as a mask.

19. The isolation structure formed by the process recited by claim 16, wherein the step of patterning comprises:

removing a region of the pad oxide film positioned under an undercut portion of the nitride film, where the first surface portion of the semiconductor substrate includes a portion of the substrate positioned under the undercut portion of the nitride film, and where the portion of the oxynitride film is removed using the undercut portion of the nitride film as a mask.

* * * * *